United States Patent
Cho et al.

(10) Patent No.: US 7,663,141 B2
(45) Date of Patent: Feb. 16, 2010

(54) ORGANIC MEMORY DEVICES INCLUDING ORGANIC MATERIAL AND FULLERENE LAYERS

(75) Inventors: Byeong-Ok Cho, Seoul (KR); Moon-Sook Lee, Seoul (KR); Takahiro Yasue, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 84 days.

(21) Appl. No.: 11/726,888

(22) Filed: Mar. 23, 2007

(65) Prior Publication Data

US 2007/0278482 A1      Dec. 6, 2007

(30) Foreign Application Priority Data

Jun. 2, 2006     (KR) .................. 10-2006-0049897

(51) Int. Cl.
 *H01L 51/00*     (2006.01)
(52) U.S. Cl. ........................... 257/40; 365/148
(58) Field of Classification Search ............ 257/40; 365/148
See application file for complete search history.

(56) References Cited

U.S. PATENT DOCUMENTS

| | | | |
|---|---|---|---|
| 6,278,127 B1 * | 8/2001 | Dodabalapur et al. | 257/40 |
| 2004/0027849 A1 * | 2/2004 | Yang et al. | 365/115 |
| 2004/0033641 A1 | 2/2004 | Yang et al. | |
| 2004/0214041 A1 | 10/2004 | Lu et al. | |
| 2004/0246770 A1 | 12/2004 | Kano | |
| 2005/0281082 A1 | 12/2005 | Miyawaki et al. | |
| 2008/0089113 A1 * | 4/2008 | Yang et al. | 365/153 |

FOREIGN PATENT DOCUMENTS

| | | |
|---|---|---|
| JP | 2004-335610 | 11/2004 |
| JP | 2006-013491 | 1/2006 |
| JP | 2006-13491 | 1/2006 |
| KR | 1020010040510 | 5/2001 |
| KR | 10-2005-0026844 | 3/2005 |
| KR | 1020060028385 A | 3/2006 |
| KR | 1020060070200 | 6/2006 |
| KR | 1020060075230 | 7/2006 |
| WO | WO/2004/015779 | 2/2004 |
| WO | WO 2004/097954 A1 | 11/2004 |
| WO | WO 2005/060005 | 6/2005 |

OTHER PUBLICATIONS

Korean Office Action issued Jun. 24, 2008 (4 pages) corresponding to Korean Patent Application No. KR 10-2006-0049897.
English Translation for Korean Office Action issued on Jun. 24, 2008 (6 pages) corresponding to Korean Patent Application No. 10-2006-0049897; Mailed: Sep. 24, 2008.

(Continued)

*Primary Examiner*—Long Pham
(74) *Attorney, Agent, or Firm*—Myers Bigel Sibley & Sajovec, P.A.

(57) ABSTRACT

An organic memory device may include a stack of an organic material layer and a fullerene layer to provide a data storage element between first and second electrodes. The data storage element may include an organic material layer formed on the first electrode, and a fullerene layer between the organic material layer and the second electrode. Methods of fabricating organic memory devices are also discussed.

19 Claims, 11 Drawing Sheets

OTHER PUBLICATIONS

Korean Intellectual Property Office Notice of Decision to Grant Patent issued on Feb. 17, 2009 for corresponding Korean Patent Application No. 10-2006-0049897, mailed May 8, 2009.

Chinese Office Action (7 pages) corresponding to Chinese Patent Application 20071018211.7; Mailing Date: Sep. 11, 2009.

* cited by examiner

ORGANIC MEMORY DEVICES INCLUDING ORGANIC MATERIAL AND FULLERENE LAYERS

RELATED APPLICATION

This application claims the benefit of Korean Patent Application No. 10-2006-0049897, filed Jun. 2, 2006, the disclosure of which is hereby incorporated herein by reference in its entirety.

FIELD OF THE INVENTION

The present invention relates to integrated circuit devices, and more particularly, to integrated circuit memory devices and related methods.

BACKGROUND

Semiconductor memory devices may be classified into volatile memory devices and non-volatile memory devices. Volatile memory devices include DRAM devices and SRAM devices, and non-volatile memory devices include flash memory devices, phase change memory devices, resistance RAM (RRAM) devices, and magnetic RAM (MRAM) devices.

In these memory devices, electronic addressing and/or logic devices used to store and/or process data have been fabricated using inorganic semiconductor materials such as crystalline silicon. While inorganic semiconductor memory devices formed of inorganic semiconductor materials have enjoyed some technical and commercial success, their complex structure may result in increased expense and reduced data storage density. Volatile memory devices formed of inorganic semiconductor materials may require continuous current to maintain stored data, resulting in heat generation and high power consumption. Non-volatile memory devices may have reduced data storage density due to more complex circuit design and may be more costly. Data processing speed may be relatively low and power consumption may be relatively high.

Attempts to apply organic materials to various electronic devices have been made, and some electronic devices (such as thin film transistors, lasers, emission diodes, etc.) successfully employ organic materials. In addition, several organic materials having electrical switching characteristics between two different states may be used as data storage elements of memory devices.

Conventional organic memory devices may include: a single organic material layer; a plurality of organic material layers and a conductive layer such as a metal particle layer between the organic material layers; or an organic compound layer with conductive nano particles dispersed in an organic matrix. An organic memory device using organic material layers with a conductive layer therebetween as a data storage element is disclosed, for example, in U.S. Patent Publication No. 2004/0246770, entitled "Organic Distable Element, Organic Distable Memory Device Using the Same, and Process for Driving the Same", filed by Kano. The disclosure of U.S. Patent Publication No. 2004/0246770 is hereby incorporated herein in its entirety by reference.

When a single organic material layer is used as a data storage element, however, only a few types of organic material layers may be suitable as data storage elements. Moreover, a single organic material layer may cause degradation of operation characteristics. In addition, when organic material layers with a conductive layer therebetween are used as a data storage element, the conductive layer may be difficult to form, especially a metal particle layer, between the organic material layers. Further, when an organic compound layer is used as a data storage element, distribution of cell characteristics may deteriorate due to segregation of conductive nano particles.

SUMMARY

According to some embodiments of the present invention, an organic memory device may have a data element including a stack of an organic material layer and a fullerene layer.

According to some other embodiments of the present invention, a method may be provided for forming an organic memory device having a data element including a stack of an organic material layer and a fullerene layer.

According to some embodiments of the present invention, an organic memory device may include a stack of an organic material layer and a fullerene layer providing a data storage element. The organic memory device may include first and second electrodes. A data storage element may be provided between the first and second electrodes. The data storage element may include an organic material layer formed on the first electrode, and a fullerene layer between the organic material layer and the second electrode so that the fullerene layer is in contact with the second electrode.

The fullerene layer may include $C_{60}$, $C_{70}$, $C_{74}$, $C_{78}$, $C_{82}$, $C_{84}$, and/or a fullerene derivative. The fullerene layer may include buckminsterfullerene. The data storage element may have one of two different resistance states which are electrically irreversible, and may be one-time programmable (OTP).

According to other embodiments of the present invention, a data storage element may include an organic compound layer having fullerene molecules dispersed in the organic material layer. The data storage element may have at least two different resistance states which are electrically reversible, and which may be reprogrammed at least twice. In addition, the data storage element may have an NDR region in which current decreases as voltage increases.

A first and/or a second electrode may be formed of a metal, a conductive metal compound, polysilicon, and/or a conductive polymer. The organic material layer may include an organic conductive layer, an organic semiconductor layer, and/or an organic insulating layer. The fullerene layer may include $C_{60}$, and the organic material layer may include polyimide.

According to still other embodiments of the present invention, an organic memory device may have a cross point structure and may use a stack of an organic material layer and a fullerene layer as a data storage element. The organic memory device may include a plurality of parallel first and second electrodes provided on a substrate. The plurality of parallel second electrodes may cross over the first electrodes to provide cross points at positions overlapping the first electrodes. A plurality of data storage elements may be provided at the respective cross points between the first and second electrodes. Each of the data storage elements may include an organic material layer on the first electrode, and a fullerene layer between the organic material layer and the second electrode, and the fullerene layer may be in direct contact with the second electrode.

According to still other embodiments of the present invention, a method of fabricating an organic memory device including a stack of an organic material layer and a fullerene layer as a data storage element may include forming a first electrode on a substrate, and forming an organic material layer on the first electrode. A fullerene layer may be formed on the organic material layer to provide a data storage element together with the organic material layer. A second electrode may be formed on the fullerene layer.

The fullerene layer may include C60, C70, C74, C78, C82, C84, and/or a fullerene derivative. In some embodiments of the present invention, the fullerene layer may include buckminsterfullerene.

Forming the organic material layer may include forming an organic precursor layer on the substrate and/or the first electrode, performing a first annealing process on the organic precursor layer at a first temperature, and performing a second annealing process on the organic precursor layer at a second temperature higher than the first temperature. The data storage element may have one of two different electrically irreversible resistance states and the data storage element may be one-time programmable (OTP).

After forming the fullerene layer, the fullerene layer may be annealed at a third temperature. Annealing the fullerene layer may include diffusing fullerene molecules from the fullerene layer into the organic material layer to form an organic compound layer. In addition, the data storage element may have at least two different electrically reversible resistance states, and the data storage element may be reprogrammed at least twice. In addition, the data storage element may have an NDR region in which current decreases as voltage increases. Furthermore, forming the organic material layer may include forming an organic precursor layer on the substrate and on the first electrode, and annealing the organic precursor layer at a fourth temperature lower than the third temperature.

The first electrode and/or the second electrode may be formed of a metal, a conductive metal compound, polysilicon, and/or a conductive polymer. The organic material layer may be formed of an organic conductive layer, an organic semiconductor layer, and/or an organic insulating layer. The fullerene layer may include C60, and the organic material layer may include polyimide.

DETAILED DESCRIPTION

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Examples of embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

Figure 1:
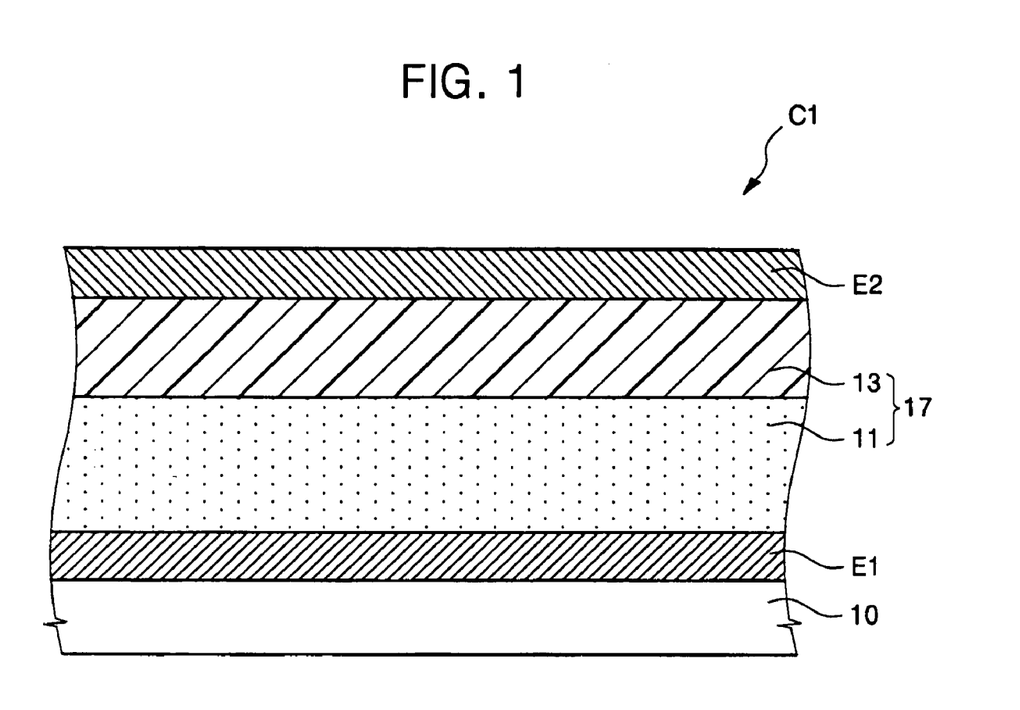
FIG. 1 is a cross-sectional view of an organic memory cell according to some embodiments of the present invention.

FIG. 1 is a cross-sectional view of an organic memory cell C1 according to some embodiments of the present invention.

Referring to FIG. 1, a unit cell C1 of an organic memory device according to some embodiments of the present invention may include a first electrode E1, a second electrode E2, and a data storage element 17 therebetween, and these layers may be sequentially deposited on a substrate 10.

The substrate 10 may be a silicon substrate, a glass substrate, a quartz substrate, and/or a flexible organic-based substrate. An organic-based substrate may be formed of an organic material such as polyamide, polyacetal, polybutylene terephthalate, polyethyleneterephthalate, polycarbonate, polycyclohexene, polysulfone, polyethersulfone, poly-arylate, and/or polyetherimide. In addition and/or in an alternative, conventional plastic materials may be used as the substrate 10.

Each of the first and second electrodes E1 and E2 may be formed of a conductive material or materials. For example, each of the first and second electrodes E1 and E2 may be formed of a metal, a conductive metal compound, polysilicon, and/or a conductive polymer. The first and/or second electrode E1 and/or E2 may include Au, Ag, Cu, Al, Ti, TiN, TiAlN, Ta, TaN, W, WN, Ir, Pt, Pd, Zr, Rh, Ni, Co, Cr, Sn, Zn, Li, Mg, Ca, and/or $IrO_2$. In addition or in an alternative, the first and/or second electrode E1 or E2 may be formed of polyacetylene, polyaniline, and/or PEDOT(3,4-polyethyl-enedioxy-thiophenepolystylene-sulfonate.

The data storage element 17 may include an organic material layer 11 and a fullerene layer 13 (such as a buckminsterfullerene layer), which are sequentially deposited on the first electrode E1. The organic material layer 11 and the fullerene layer 13 may be provided as separate layers. Each of the organic material layer 11 and the fullerene layer 13 may have a thickness in the range of about 50 Å (Angstroms) to about 1000 Å (Angstroms). In addition, the fullerene layer 13 may be in direct contact with the second electrode E2.

The organic material layer 11 may be an organic conductive layer, an organic semiconductor layer, and/or an organic insulating layer. For example, the organic material layer 11 may be formed of a polystyrene, a polycarbonate, a polymethylmethacrylate(PMMA), a polyolefine, a polyester, a polyamide, a polyimide, a polyurethane, a polyaccetal, a polysulfonate, a novolac, a polyacetate, a polyalkyd, a polyamideimide, a polysiloxane, a polyarylate, a polyarylsulfone, a polyetherimide, a polytetrafluoro-ethylene, a polychlorotrifluoroethylene, a polyvinylidene fluoride, a polyvinyl fluoride, a polyetherketone, a polyether etherketone, a polybenzoxazole, a poly(phenylene vinylene) (PPV), a polyfluorene (PF), a polythiophene (PT), a poly(paraphenylene) (PPP), a polyvinylcarbazole (PVK), and/or derivatives thereof, and/or copolymers thereof.

The fullerene layer 13 may be a carbon molecule layer (also is referred to as a buckyball), and may be formed of C60 according to some embodiments of the present invention. C60 is an N-type organic semiconductor material having a lowest unoccupied molecular orbital (LUMO) level of about 3.6 eV and a highest occupied molecular orbital (HOMO) level of about 6.2 eV, which can provide a charge transfer complex by accommodating electrons in the LUMO level. In addition or in an alternative, the fullerene layer 13 may be formed of a molecule such as C70, C74, C78, C82 and/or C84, and/or a fullerene derivative such as [6,6]-phenyl c61butyric acid methyl ester (PCBM). According to some embodiments of the present invention, the fullerene layer 13 may include a spherical and/or ellipsoidal fullerene such as a buckminsterfullerene.

In accordance with some embodiments of the present invention, the data storage element 17 (including the organic material layer 11 and the fullerene layer 13, which are sequentially deposited and interposed between the first and second electrodes E1 and E2) may have one of two different resistance states, which may be electrically irreversible, and which may be one-time programmable. For example, the data storage element 17 may have a low resistance state on the order of kΩ (kilo-ohms) or a high resistance state on the order of GΩ (giga-ohms), which may be electrically irreversible.

Data may be written to the data storage element 17 by applying a write voltage between the first and second electrodes E1 and E2 to switch the data storage element 17 from a low resistance state to a high resistance state. The data stored in the data storage element 17 may be maintained (i.e., not erased) even after power-off. Once the data storage element 17 has been switched to the high resistance state the data storage element may stably maintain the resistance state, and may not be re-switched to the low resistance state.

Figure 2:
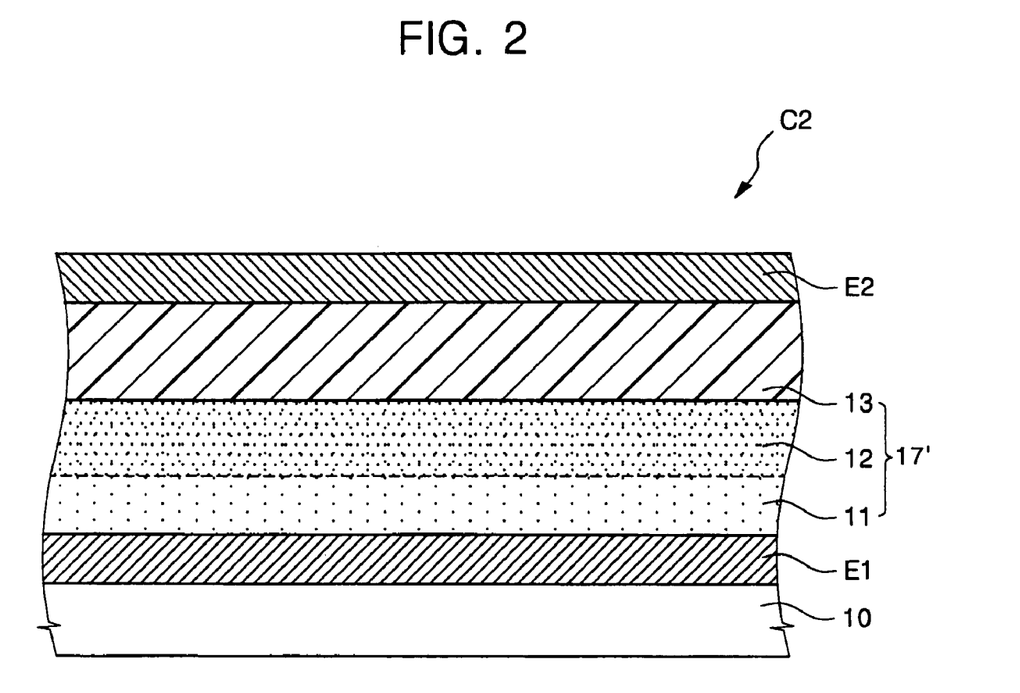
FIG. 2 is a cross-sectional view of an organic memory cell according to some other embodiments of the present invention.

FIG. 2 is a cross-sectional view of an organic memory cell C2 in accordance with other embodiments of the present invention. Referring to FIG. 2, a unit cell C2 of an organic memory device may include first and second electrodes E1 and E2, and a data storage element 17' therebetween, which may be sequentially deposited on a substrate 10. As shown in FIG. 1, the data storage element 17' may include an organic material layer 11 on the first electrode E1, and a fullerene layer 13 (e.g., a C60 layer) in contact with the second electrode E2. The data storage element 17' may also include an organic compound layer 12 having fullerene molecules dispersed in a portion of the organic material layer 11. The fullerene molecules dispersed in the organic material layer 11 may be provided by diffusion from the fullerene layer 13. Therefore, as shown in FIG. 2, the organic compound layer 12 may be between the organic material layer 11 and the fullerene layer 13. Depending on the diffusion level, the fullerene molecules may be uniformly dispersed throughout the organic material layer 11. In this case, the organic material layer 11 shown in FIG. 2 may also be an organic compound layer having the fullerene molecules dispersed therein.

As described above, when the data storage element 17' includes the organic compound layer 12, the data storage element 17' may have memory characteristics different from memory characteristics of the data storage element 17 FIG. 1. That is, the data storage element 17' may have at least two different resistance states which are electrically reversible, and which may be reprogrammed at least twice. In addition, an I-V curve of the data storage element 17' may have a negative differential resistance (NDR) region in which the current decreases as the voltage increases. The data storage element 17' may have two different resistance states (i.e., a low resistance state and a high resistance state) which may be reversible and repeatedly switched.

In this case, switching the data storage element 17' to the high resistance state may include applying a first polarity (for example, a positive reset voltage) between the first and second electrodes E1 and E2. A reset voltage may have a value equal to or larger than a critical voltage at which the NDR region starts. The data storage element 17' may be switched to the high resistance state by the reset voltage, and the high resistance state may be maintained even after power-off. After the data storage element 17' has been switched to the high resistance state, it may be switched to a low resistance state by applying a second polarity, for example, a negative set voltage, and the low resistance state may also be maintained even after power-off.

The data storage element 17' may have at least two different resistance states, which may be reversible and repeatedly switched. Switching the data storage element 17' to each resistance state may include applying a write voltage between the first and second electrodes E1 and E2. The write voltage may have a value equal to or larger than a critical voltage at which the NDR region starts, and that corresponds to each resistance state. In this case, the data storage element 17' may store at least 2 bits of data to provide multi-bit data storage. In addition, since uni-polar switching between the respective states can be performed, when the data storage element 17' is serially connected to a diode device, a highly integrated circuit having a cross-point structure may be provided.

Figure 3:
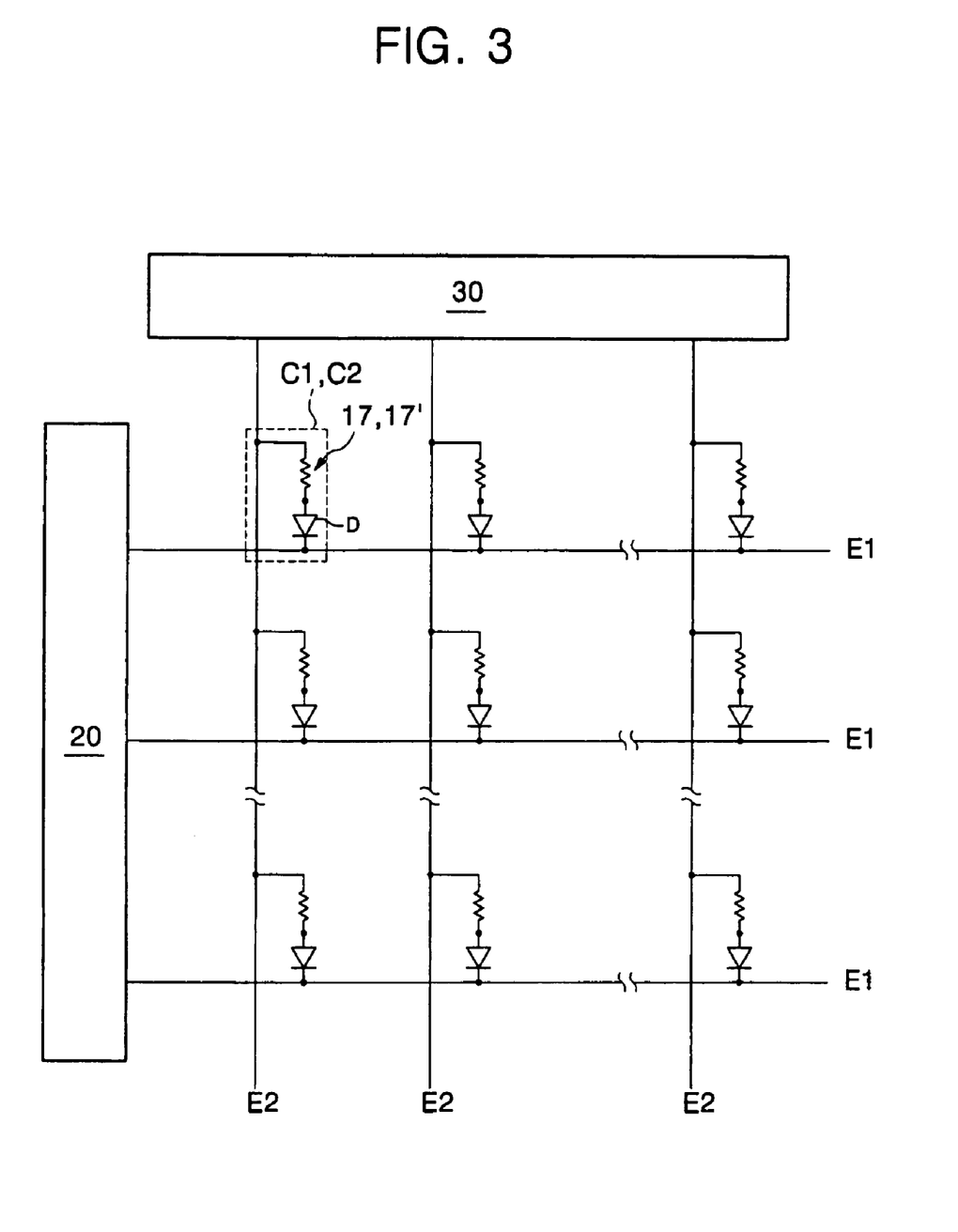
FIG. 3 is an equivalent circuit diagram of a portion of an organic memory device employing organic memory cells according to some embodiments of the present invention.
Figure 4:
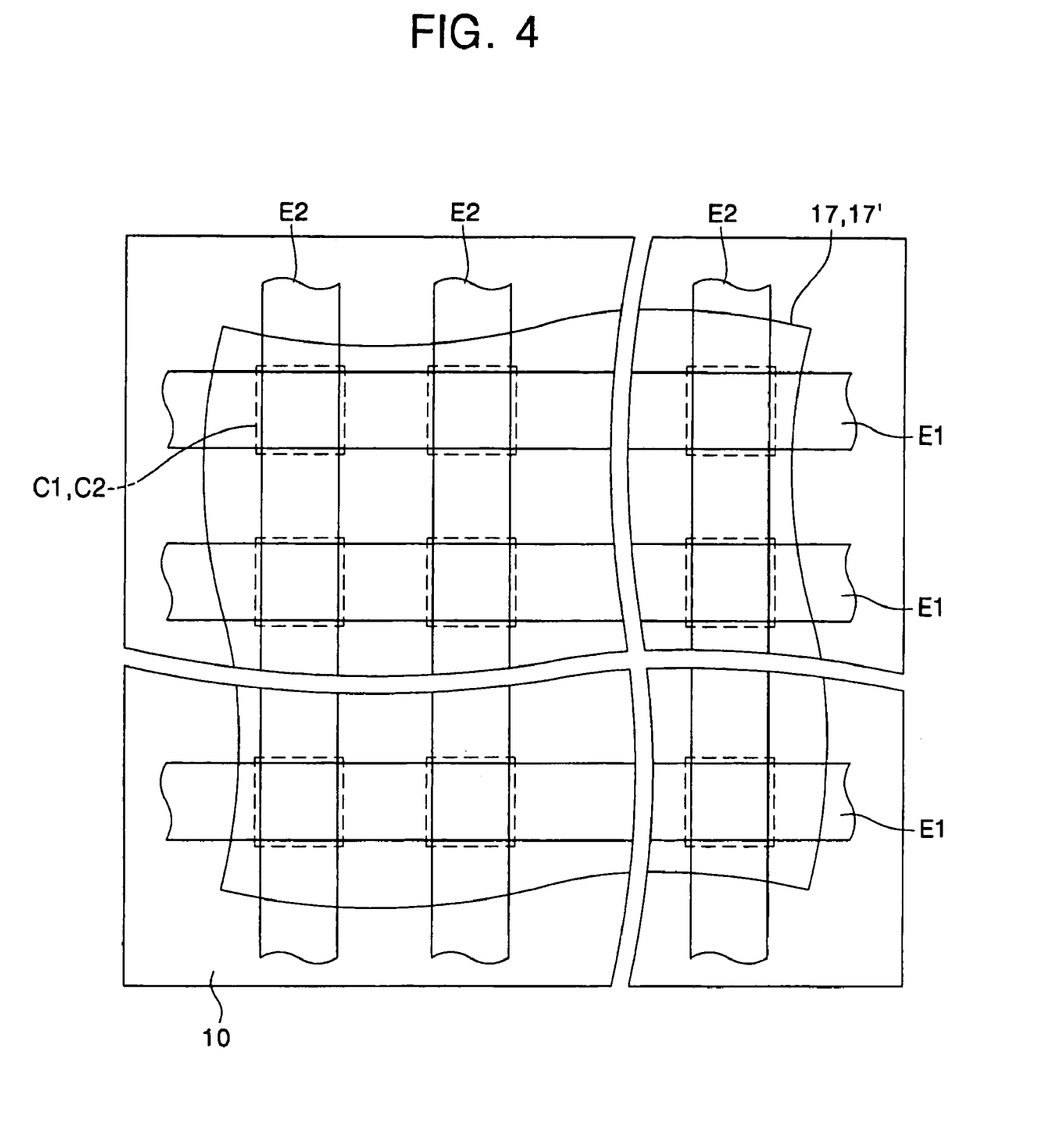
FIG. 4 is a plan view corresponding to FIG. 3.

FIG. 3 is an equivalent circuit diagram of a portion of an organic memory device employing organic memory cells according to some embodiments of the present invention, and FIG. 4 is a plan view corresponding to FIG. 3. FIGS. 1 and 2 are cross-sectional views of organic memory cells C1 and C2 in directions of the electrodes E1 and/or E2 shown in FIG. 4.

Referring to FIGS. 3 and 4, an organic memory device may include a plurality of first electrodes E1, and a plurality of second electrodes E2 crossing the first electrodes E1. The first electrodes E1 may be disposed in parallel lines on a substrate 10, and the second electrodes E2 may cross over the first electrodes E1 to provide cross points at positions overlapping the first electrodes E1. The first and second electrodes E1 and E2 may be connected to first and second driving circuits 20 and 30 to be selectively adjusted, respectively. The organic memory cells C1 and C2 according to some embodiments of the present invention may be disposed at the cross points. The organic memory cells C1 and C2 may include the data storage elements 17 and 17' between respective ones of the first and second electrodes E1 and E2. Since the organic memory cells C1 and C2 (including the data storage elements 17 and 17') are described with reference to FIGS. 1 and 2 in detail, description thereof will not be repeated.

The data storage elements 17 and 17' may be electrically connected in series with diodes D between respective electrodes E1 and E2. The diodes D may be disposed at the cross points between the first electrodes E1 and the data storage elements 17 and 17'. In this case, lower electrodes corresponding to nodes between the diodes D and the data storage elements 17 and 17' may be disposed between the diodes D and the data storage elements 17 and 17'.

An organic memory device having a cross point structure with organic memory cells C1 and C2 according to some embodiments of the present invention is described with reference to FIGS. 3 and 4. The organic memory cells C1 and C2 according to other embodiments of the present invention may also be applied to organic memory devices having other structures. For example, the organic memory cells C1 and C2 may be electrically connected in series with a switching device formed on a substrate, similar to a capacitor of a conventional DRAM structure.

Figure 5:
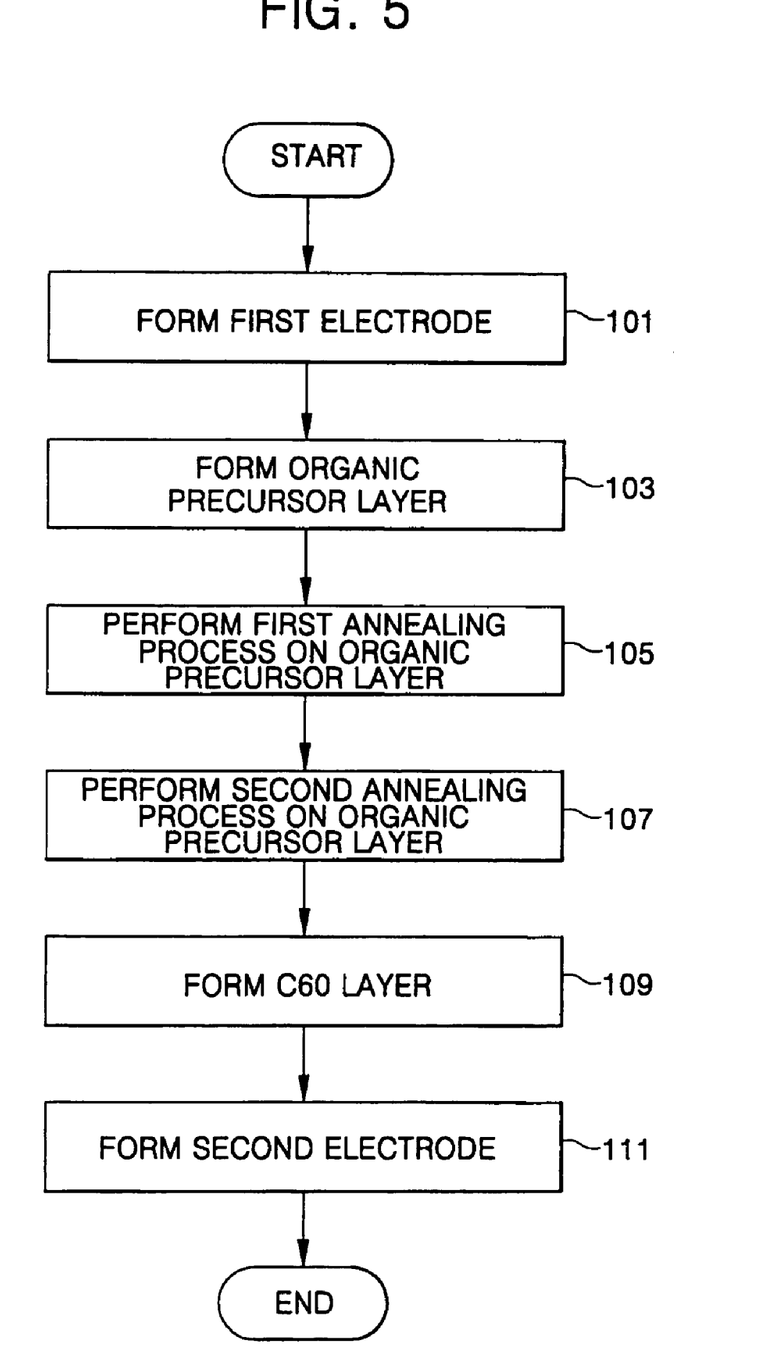
FIG. 5 is a flowchart illustrating operations of fabricating an organic memory device according to some embodiments of the present invention.

Methods of fabricating organic memory devices according to some embodiments of the present invention will now be described. FIG. 5 is a flowchart illustrating operations of fabricating an organic memory device according to some embodiments of the present invention.

Referring to FIGS. 1, 4 and 5, first electrodes E1 may be formed on a substrate 10 (S101 of FIG. 5). The first electrodes E1 may be formed of a metal, a conductive metal compound, polysilicon, and/or a conductive polymer. The first electrodes E1 may be formed, for example, using an evaporation process, a sputtering process, and/or a chemical vapor deposition process. As shown in FIG. 4, the first electrodes E1 may be formed as multiple parallel lines on the substrate 10.

An organic material layer 11 may be formed on the first electrodes E1. The organic material layer 11 may be an organic conductive layer, an organic semiconductor layer, and/or an organic insulating layer. Forming the organic material layer 11 may include forming an organic precursor layer on the substrate 10 including the first electrode E1 (S103 of FIG. 5), performing a first annealing process on the organic precursor layer (S105 of FIG. 5), and performing a second annealing process on the organic precursor layer (S107 of FIG. 5). The organic precursor layer may be formed using a spin coating process. The first annealing process may be a soft bake process used to remove an organic solvent in the organic precursor layer, and may be performed at a temperature in the range of about 80° C. (degrees C.) to about 150° C. (degrees C.). The second annealing process may include a hard bake and/or cure process used to convert the organic precursor layer into the organic material layer 11 by dehydration condensation reaction, and adjusting properties of the organic material layer 11. The second annealing process may be performed in an atmosphere of an inert gas such as argon (Ar), air, or nitrogen ($N_2$), at a temperature in the range of about 200° C. (degrees C.) to about 400° C. (degrees C.) for about 30 minutes to about 120 minutes.

Next, a fullerene layer 13 (e.g., a C60 layer) may be formed on the organic material layer 11 (S109 of FIG. 5). The fullerene layer 13 may be formed using an evaporation process using fullerene powder only, and/or a spin coating process using an appropriate organic solvent. The fullerene layer 13 may be formed on the organic material layer 11 cured by the second annealing process. Therefore, it may be possible to increase suppression of reaction and/or diffusion between the fullerene molecules and organic materials at an interface between the fullerene layer 13 and the organic material layer 11. The fullerene layer 13 and the organic material layer 11 may be provided as a data storage element 17 of an organic memory device.

After forming the fullerene layer 13, a second electrode E2 may be formed on the fullerene layer 13 (S111 of FIG. 5). The second electrode E2 may be formed of a metal, a conductive metal compound, polysilicon, and/or a conductive polymer. The second electrode E2 may be formed using an evaporation process, a sputtering process, or a chemical vapor deposition process. As shown in FIG. 4, the second electrodes E2 may be formed as multiple parallel lines to provide cross points at positions overlapping the first electrodes E1.

A data storage element 17 of an organic memory device fabricated using processes described above may have one of two resistance states, which are different from each other and electrically irreversible. Such a memory device may thus be one-time programmable (OTP).

Figure 6:
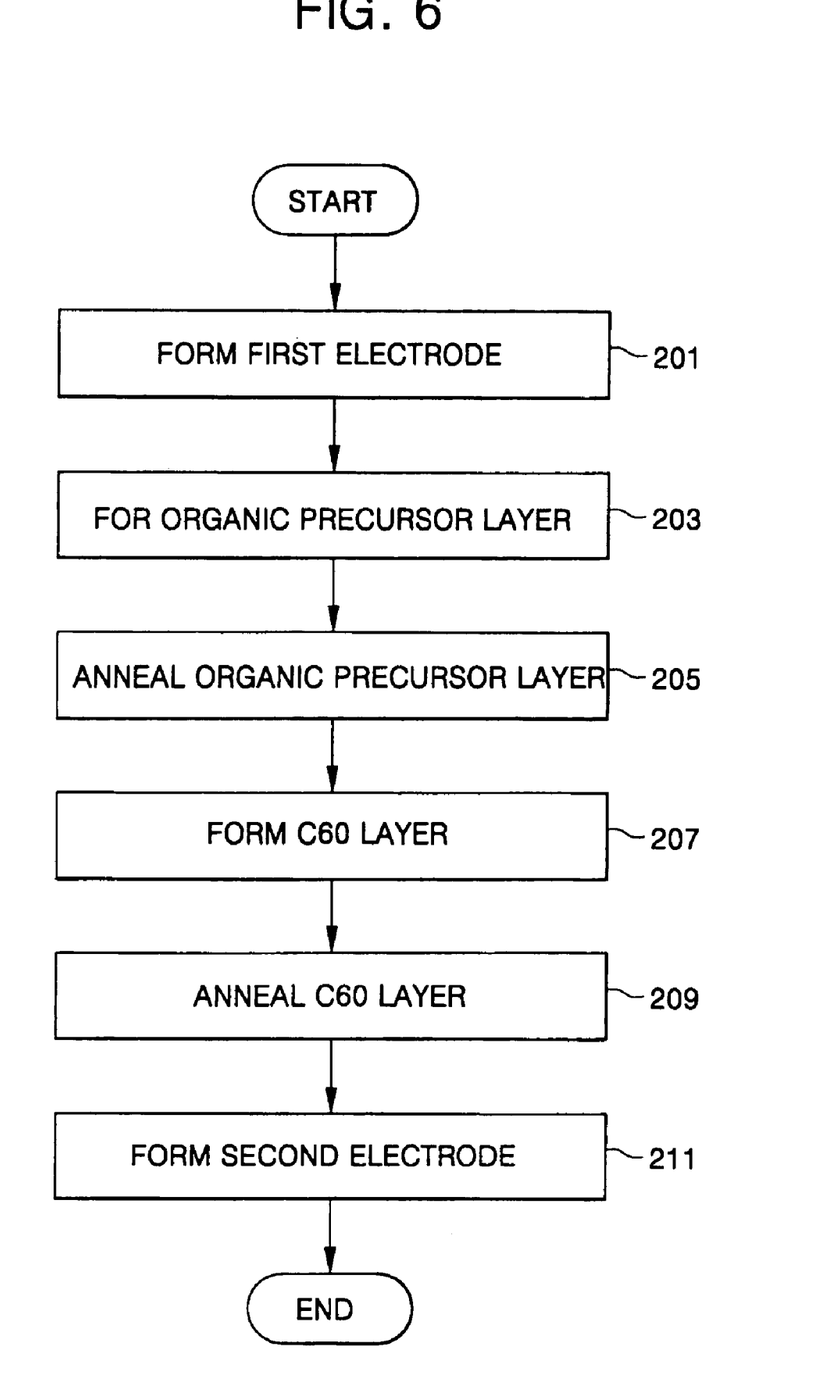
FIG. 6 is a flowchart illustrating operations of fabricating an organic memory device according to some other embodiments of the present invention.

FIG. 6 is a flowchart illustrating operations of fabricating organic memory devices according to other embodiments of the present invention. Referring to FIGS. 2, 4 and 6, first electrodes E1 may be formed on a substrate 10 (S201 of FIG. 6), and an organic material layer 11 may be formed on the first electrodes E1. Forming the organic material layer 11 may include forming an organic precursor layer on the substrate 10 including the first electrode E1 (S203 of FIG. 6), and annealing the organic precursor layer (S205 of FIG. 6). The annealing process may be a soft bake process used to remove an organic solvent in the organic precursor layer, which may be performed at a temperature in the range of about 80° C. (degrees C.) to about 150° C. (degrees C.).

After annealing the organic precursor layer, a fullerene layer 13 (e.g., a C60 layer) may be formed on the organic material layer 11. In this case, unlike the description of FIG. 5, before forming the fullerene layer 13, a hard bake process and/or a curing process of the organic precursor layer may be omitted.

Then, the fullerene layer 13 may be annealed. Annealing the fullerene layer 13 may be performed in an atmosphere of an inert gas such as argon (Ar), air or nitrogen ($N_2$), at a temperature in the range of about 200° C. (degrees C.) to about 400° C. (degrees C.) for a time in the range of about 30 minutes to about 120 minutes. Annealing conditions of the fullerene layer 13 may be the same as conditions of the hard bake and/or curing process of the organic precursor layer.

In accordance with still other embodiments of the present invention, before forming the fullerene layer 13, the hard bake or curing process of the organic precursor layer may be omitted. Therefore, fullerene molecules (e.g., C60 molecules) in the fullerene layer 13 may be readily diffused into the organic material layer 11 during the annealing of the fullerene layer 13. As a result, an organic compound layer 12 including the fullerene molecules (e.g., C60 molecules) that are diffused from the fullerene layer 13 and dispersed in the organic material layer 11 may be formed. As shown in FIG. 2, the organic compound layer 12 may be formed to be disposed between the organic material layer 11 and the fullerene layer 13. Depending on annealing conditions of the fullerene layer 13, the fullerene molecules may be uniformly dispersed in the organic material layer 11. In this case, the organic material layer 11 shown in FIG. 2 may also be an organic compound layer including the fullerene molecules.

The organic material layer 11, the organic compound layer 12, and the fullerene layer 13 may provide a data storage element 17' of an organic memory device according to other embodiments of the present invention.

After annealing the fullerene layer 13, processes described with respect to FIG. 5 may be performed to form a second electrode E2.

A data storage element 17' of an organic memory device formed using processes described with respect to FIG. 6 may have at least two resistance states which are different from each other and electrically reversible, and may be reprogrammed at least twice. In addition, an I-V curve of the data storage element 17' may have a negative differential resistance (NDR) region in which the current decreases as voltage increases.

EXAMPLE 1

Figure 7:
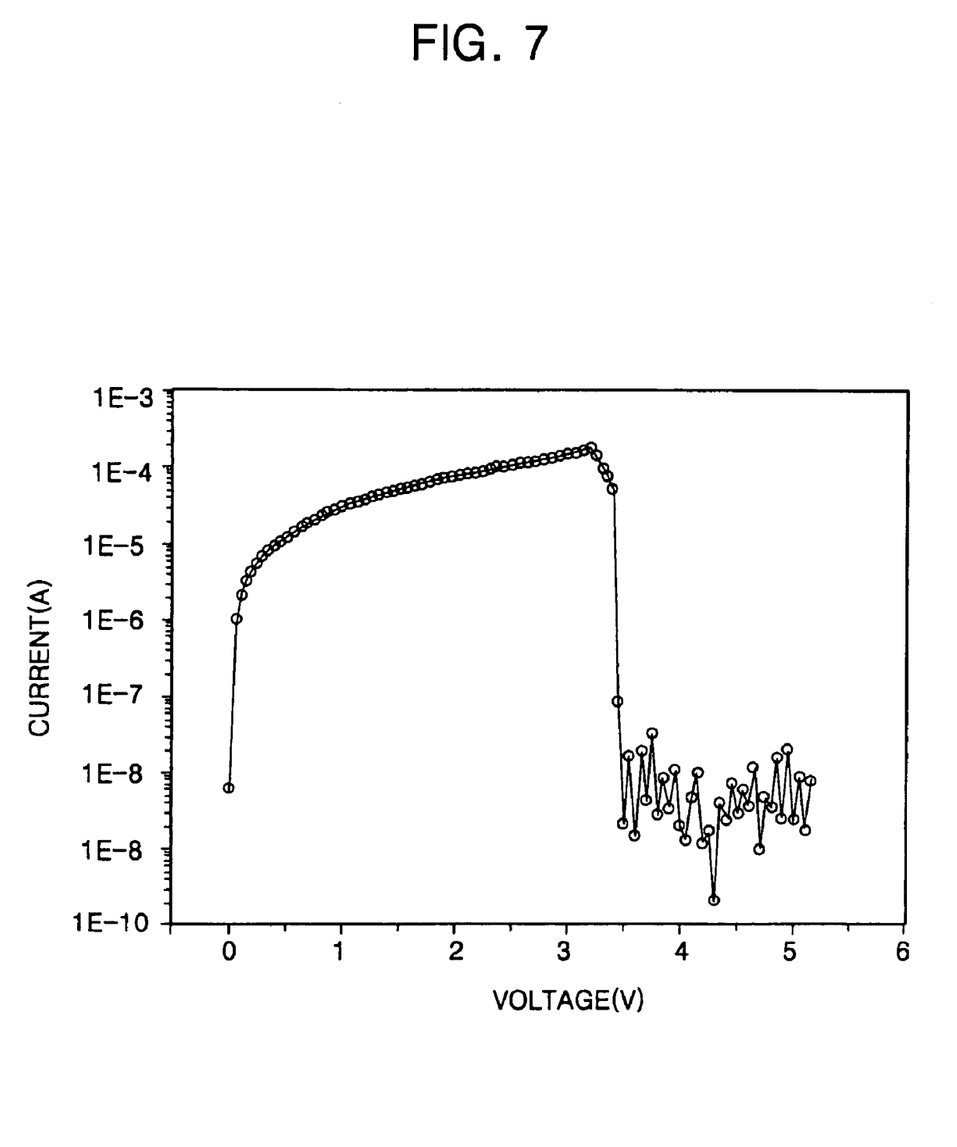
FIGS. 7 and 8 are graphs illustrating I-V characteristics of an organic memory cell C1 according to some embodiments of the present invention.
Figure 8:
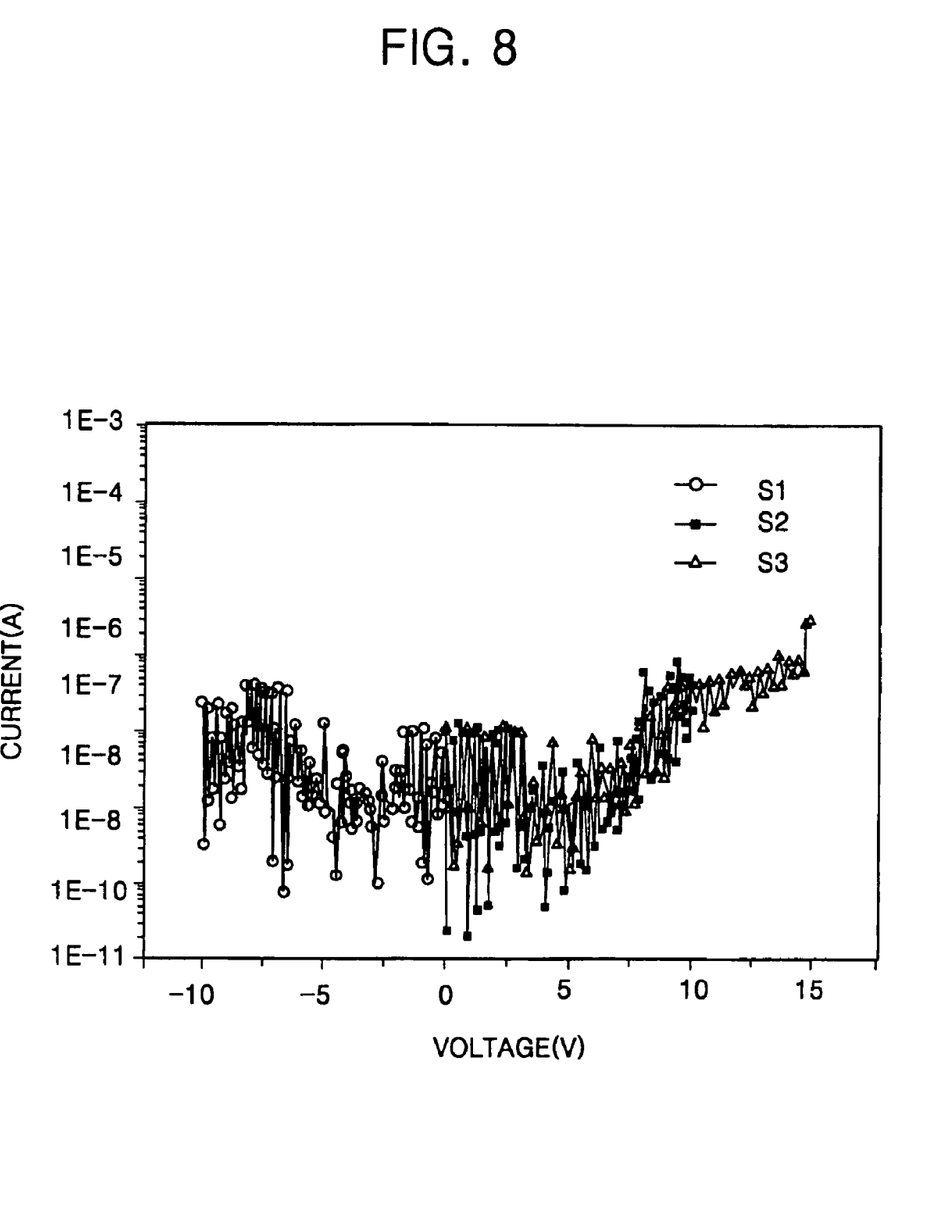

FIGS. 7 and 8 are graphs showing I-V characteristics of an organic memory cell C1 according to some embodiments of the present invention. Measurement results of FIGS. 7 and 8 may be obtained after grounding a first electrode E1, and applying a bias voltage to a second electrode E2. An initial resistance of the fabricated data storage element may be about 35 k$\Omega$ (kilo-ohms).

The memory cell C1 according to some embodiments of the present invention providing results of FIGS. 7 and 8 may be fabricated using process conditions described in Table 1.

TABLE 1

| | | | |
|---|---|---|---|
| Substrate 10 | | | Single crystalline silicon substrate |
| First electrode E1 | | Process | Evaporation process |
| | | Material | Aluminum |
| | | Thickness/Width | 800 Å/500 μm |
| Data storage element 17 | Organic material layer 11 (polyimide) | Precursor | Polyamic acid |
| | | First annealing | Nitrogen atmosphere/120° C./3 minutes |
| | | Second annealing | Nitrogen atmosphere/300° C./50 minutes |
| | C60 layer 13 | Process | Evaporation process ($10^{-7}$ Torr/590° C.) |
| | | Precursor | C60 |
| Second electrode E2 | | Process | Evaporation process |
| | | Material | Aluminum |
| | | Thickness/Width | 800 Å/500 μm |

As shown in FIG. 7, the data storage element 17 of the organic memory cell C1 according to some embodiments of the present invention may be switched to a high resistance state of about 1.5 G$\Omega$ (giga-ohms) with a rapid decrease in current when a bias voltage of about 3V was applied. As shown in FIG. 8, the data storage element 17 switched to the high resistance state may stably maintain the high resistance state, without switching to a low resistance state even when a bias voltage is re-applied. In FIG. 8, data designated by reference numeral S1 represents a sweep curve obtained when the bias voltage is swept from 0 V to −10 V, and data designated by reference numeral S2 represents a sweep curve obtained when the bias voltage is swept from 0 V to 10 V. In addition, data designated by reference numeral S3 represents a sweep curve obtained when the bias voltage is swept from 0 V to 15 V.

That the data storage element 17 of the organic memory cell C1 according to some embodiments of the present invention may thus have one of two resistance states, which are different from each other and electrically irreversible, and the data storage elements may be one-time programmable (OTP).

EXAMPLE 2

Figure 9:
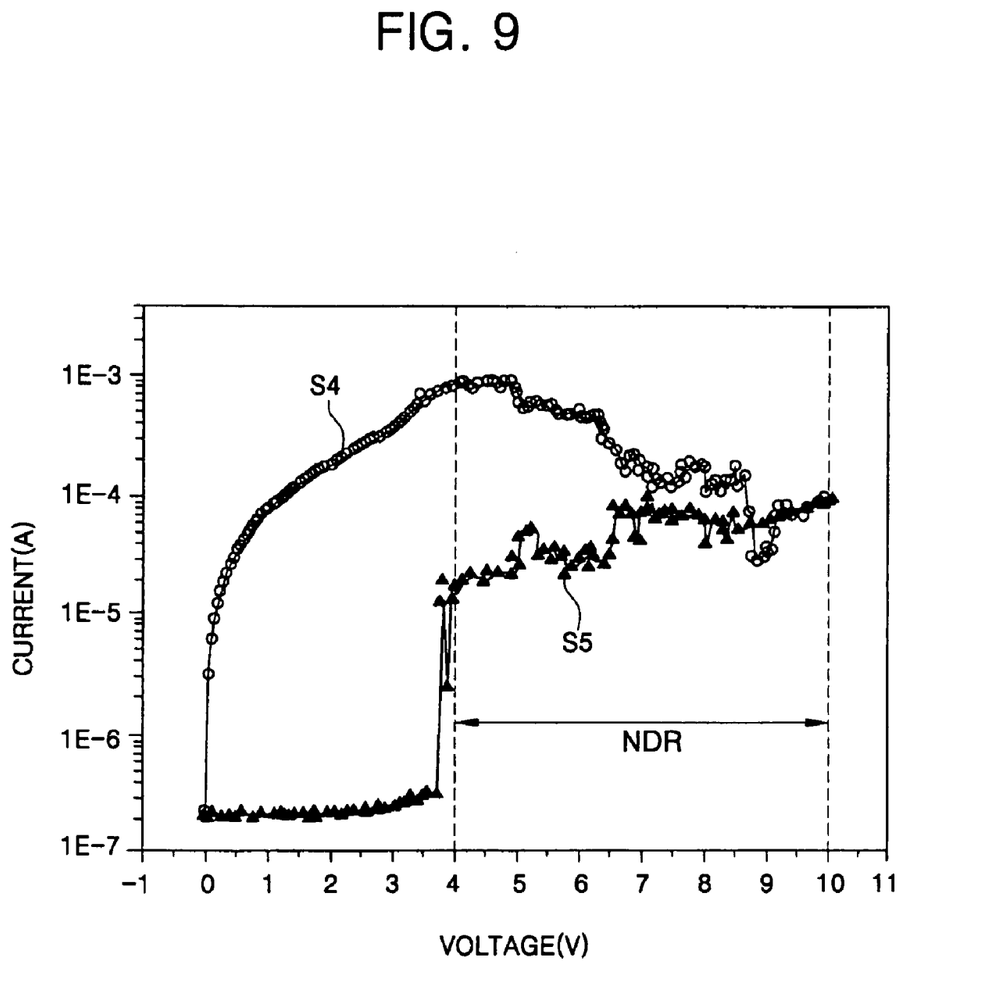
FIGS. 9 and 10 are graphs illustrating I-V characteristics of an organic memory cell C2 according to still other embodiments of the present invention.
Figure 10:
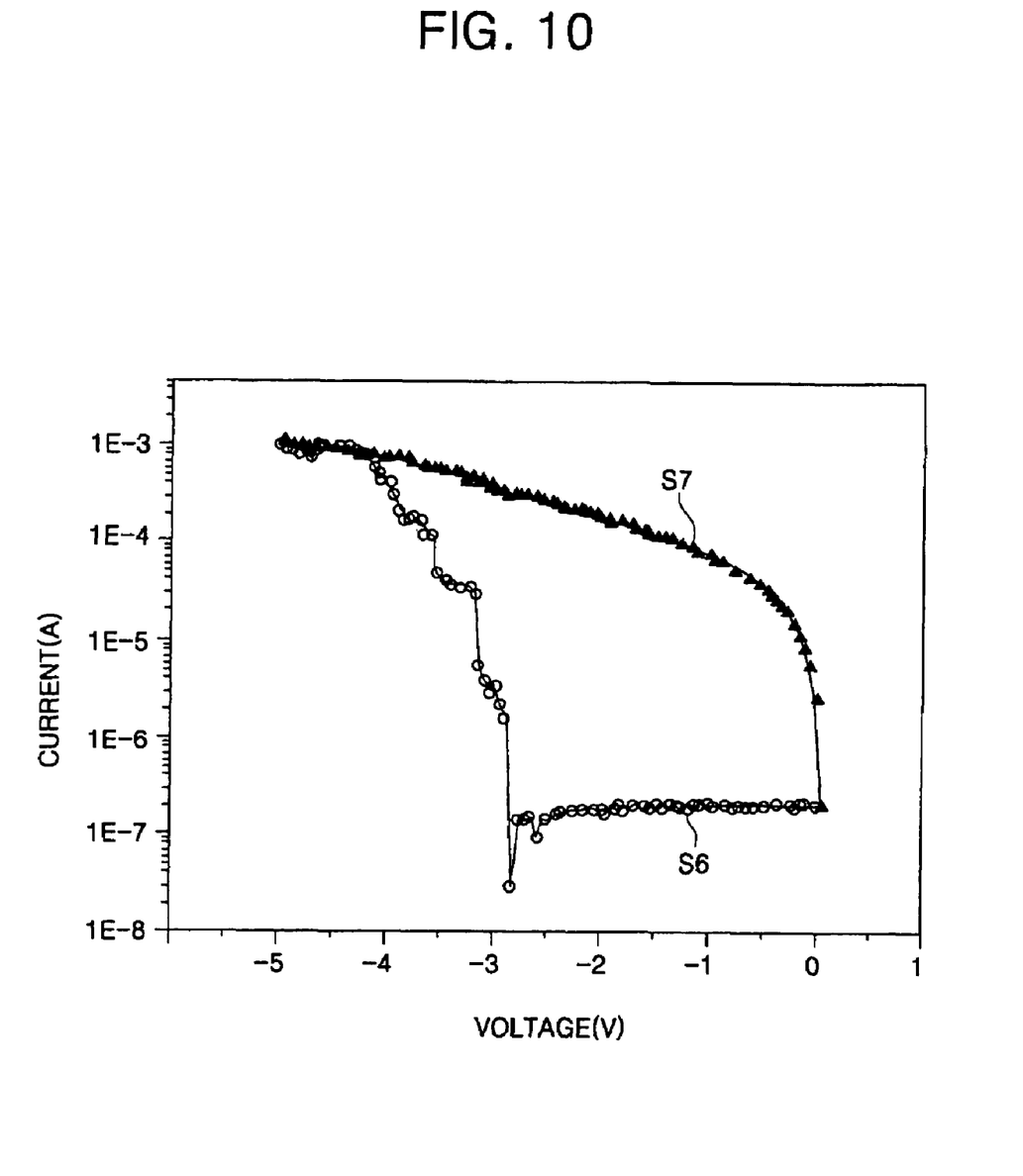

FIGS. 9 and 10 are graphs showing I-V characteristics of an organic memory cell C2 according to some embodiments of the present invention shown in FIG. 2. FIG. 9 shows reset characteristics of a data storage element 17' of the organic memory cell C2 according to some embodiments of the present invention, and FIG. 10 shows set characteristics of the data storage element 17' of the organic memory cell C2 according to some embodiments of the present invention.

Measurement results of FIGS. 9 and 10 may be obtained after grounding a first electrode E1, and applying a bias voltage to a second electrode E2. An initial resistance of the fabricated data storage element 17' may be about 500 kΩ (kilo-ohms).

The memory cell C2 according to some embodiments of the present invention providing results of FIGS. 9 and 10 may be fabricated using process conditions described in Table 2.

TABLE 2

| | | | |
|---|---|---|---|
| Substrate 10 | | | Single crystalline silicon substrate |
| First electrode E1 | | Process | Evaporation process |
| | | Material | Aluminum |
| | | Thickness/Width | 800 Å/500 μm |
| Data storage element 17' | Organic material layer 11 (polyimide) | Precursor | Polyamic acid |
| | | Annealing | Nitrogen atmosphere/120° C./3 minutes |
| | C60 layer 13 | Process | Evaporation process ($10^{-7}$ Torr/590° C.) |
| | | Precursor | C60 powder |
| | C60 layer annealing | | Nitrogen atmosphere/300° C./50 minutes |
| Second electrode E2 | | Process | Evaporation process |
| | | Material | Aluminum |
| | | Thickness/Width | 800 Å/500 μm |

Referring to FIG. 9, as shown by first sweep curve S4, current may increase with bias voltage up to about 4V. Beyond about 4V, however, the current may slowly decrease despite increase of the bias voltage, so that an NDR region may be found. When the bias voltage of the NDR region is applied, the data storage element 17' may be switched to a high resistance state, which is stably maintained even when the power is OFF. As shown by second sweep curve S5, when the bias voltage is swept again to the data storage element 17' switched to the high resistance state, the high resistance state (in which relatively little current flows) may be maintained up to a bias voltage of about 4V. Then, the current may abruptly increase at about 4V and the second sweep curve S5 may show a tendency similar to the first sweep curve S4 in the NDR region. Similar results may be obtained when a negative bias voltage is applied to the data storage element 17'. When the bias voltage is larger in magnitude than about −4V, the NDR region may be found and the data storage element 17' may be switched to the high resistance state.

Referring to FIG. 10, as shown by first sweep curve S6, the data storage element 17' may maintain a reset state (i.e., a high resistance state) at a negative bias voltage smaller than about −3V. However, the current may abruptly increase at a bias voltage of about −3V and may increase to about four orders of magnitude larger than in the high resistance state at a bias voltage of about −4V. The data storage element 17' may thus be switched to a low resistance state (i.e., a set state at a negative bias voltage larger than about −3V), and the low resistance state may be stably maintained even when the power is OFF. As shown by second sweep curve S7, when a negative bias voltage is swept again to the data storage element 17' switched to the low resistance state, the current may increase from the low bias voltage. Similar results may be obtained when a positive bias voltage is applied to the data storage element 17'. As shown in FIG. 9, when the data storage element 17' is switched to a high resistance state using a negative bias voltage of about −4V, the data storage element 17' may be switched to a low resistance state using a positive bias voltage of about 3V.

Figure 11:
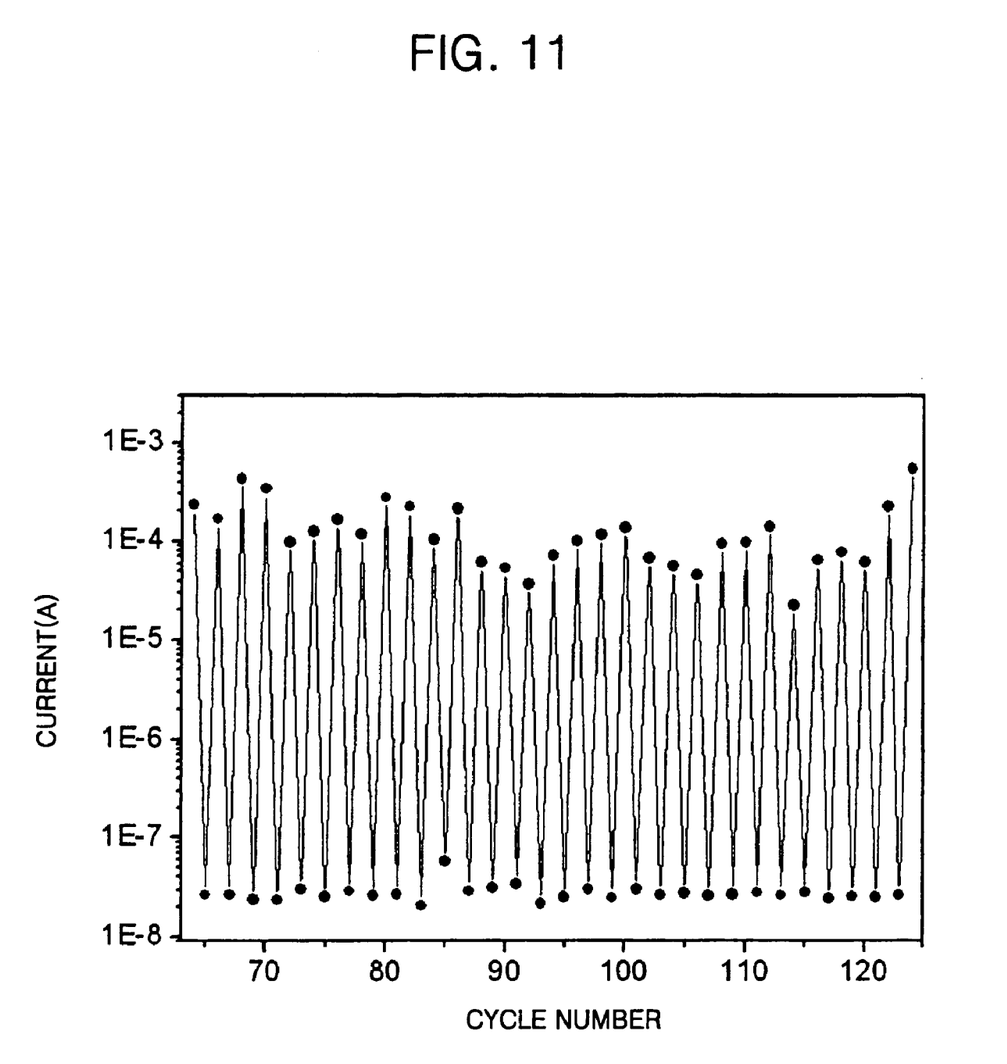
FIG. 11 is a graph illustrating switching characteristics of an organic memory cell C2 according to some embodiments of the present invention.

FIG. 11 is a graph showing switching characteristics of an organic memory cell C2 according to some embodiments of the present invention. In FIG. 11, to switch the data storage element 17' to a high resistance state, a reset pulse having a voltage of about 10V and a width (or duration) of about 2 seconds may be used, and to switch the data storage element 17' to a low resistance state, a set pulse having a voltage of about −5V and a width (or duration) of about 2 seconds may be used. In addition, a read operation may be performed at about 2V. An organic memory cell C2 according to some embodiments of the present invention showing measurements of FIG. 11 may be fabricated using process conditions described in Table 2.

As shown in FIG. 11, the data storage element 17' may be reversibly and repeatedly switched between high and low resistance states with a sufficiently large margin of about four orders of magnitude.

Figure 12:
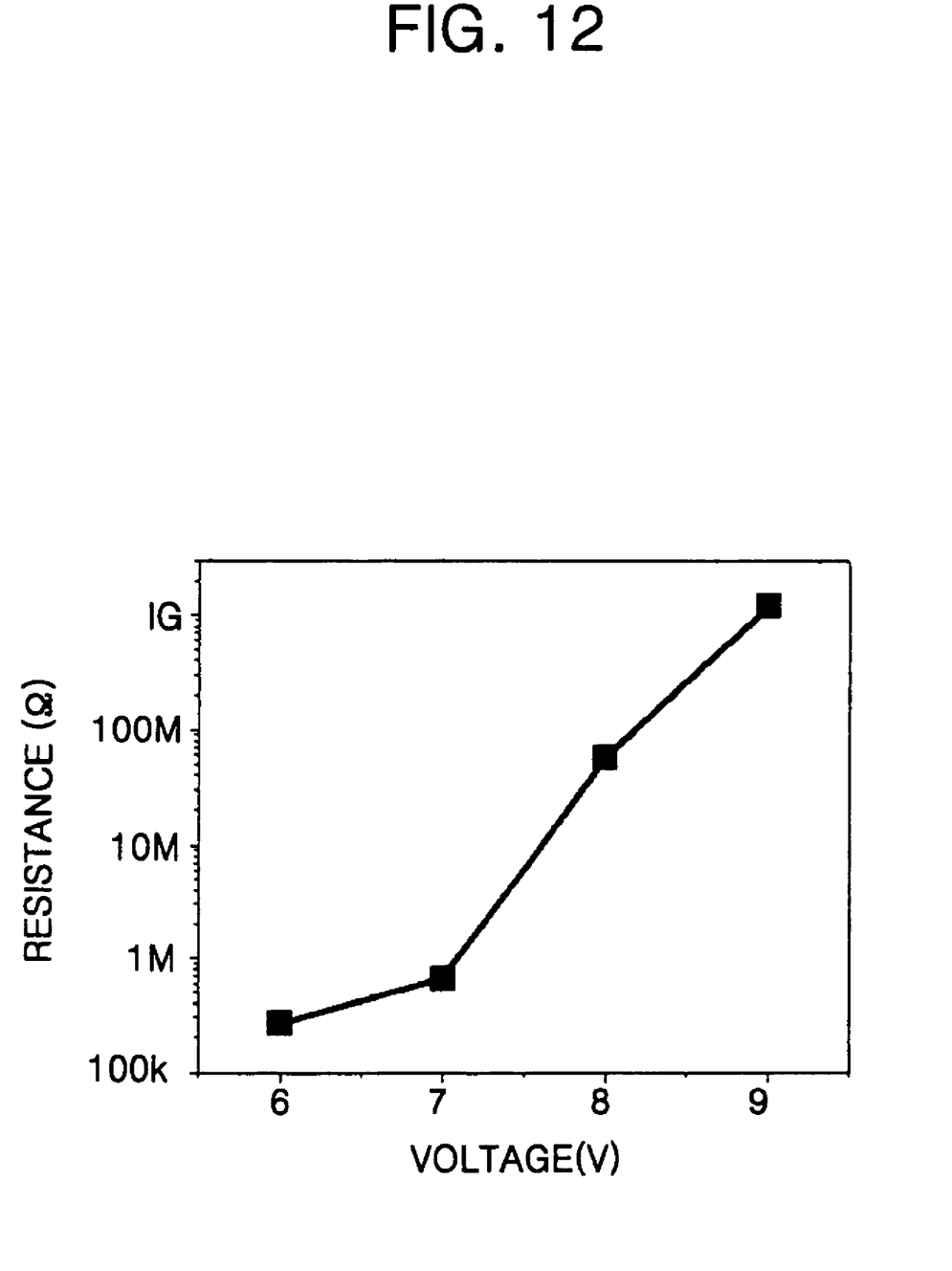
FIG. 12 is a graph illustrating multi-bit data storage characteristics of an organic memory cell C2 according to some embodiments of the present invention.

FIG. 12 is a graph showing multi-bit data storage characteristics of an organic memory cell C2 according to some embodiments of the present invention.

The organic memory cell C2 according to some embodiments of the present invention showing measurements of FIG. 12 may be fabricated using process conditions described in Table 2. In addition, FIG. 12 shows resistance values of data storage element 17' as a result of sweeping the bias voltages to 6V, 7V, 8V, and 9V, respectively.

Referring to FIG. 12, the data storage element 17' may have resistance values of about 200 kΩ, 1 MΩ, 100 MΩ, and 1 GΩ when the bias voltage is swept to 6V, 7V, 8V, and 9V, respectively. As shown in FIG. 9, when different bias voltages of the NDR region are applied, the data storage element 17' may have at least two different resistance states corresponding to each bias voltage. This result shows that the data storage element 17' may store at least two bits of data. In addition, by switching between at least two different resistance states without changing the polarity of the bias voltage, single polarity switching may be performed, and therefore, the data storage element may be serially connected to a diode device to provide a more highly integrated circuit.

As can be seen from the foregoing, an organic memory device according to some embodiments of the present invention may include a data storage element formed of a stack of an organic material layer and a fullerene layer. The data storage element may be fabricated to provide various memory characteristics using a relatively simple process. As a result, an organic memory device according to some embodiments of the present invention can be widely applied to various electronic devices.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. An organic memory device comprising:
   a first electrode;
   a second electrode; and
   a data storage element electrically connected between the first and second electrodes, wherein the data storage element includes an organic material layer on the first electrode and a fullerene layer between the organic material layer and the second electrode, and wherein the fullerene layer is in contact with the second electrode, wherein the data storage element further comprises an organic compound layer between the organic material layer and the fullerene layer, wherein the organic compound layer includes fullerene molecules dispersed in an organic material.

2. The organic memory device according to claim 1, wherein the fullerene layer comprises C60, C70, C74, C78, C82, C84, and/or a fullerene derivative.

3. The organic memory device according to claim 1, wherein the fullerene layer comprises C60.

4. The organic memory device according to claim 1, wherein the fullerene layer comprises a spherical and/or ellipsoidal fullerene.

5. The organic memory device according to claim 1, wherein the data storage element is configured to provide one of two different electrically irreversible resistance states, to provide one-time programmable (OTP) operation.

6. The organic memory device according to claim 1, wherein the data storage element is configured to provide at least two different electrically reversible resistance states, to provide reprogrammable operation.

7. The organic memory device according to claim 1, wherein the data storage element is configured to provide a negative differential resistance (NDR) operating region wherein current decreases as voltage increases.

8. The organic memory device according to claim 1, wherein the first electrode comprises a metal, a conductive metal compound, polysilicon, and/or a conductive polymer, and/or wherein the second electrode comprises a metal, a conductive metal compound, polysilicon, and/or a conductive polymer.

9. The organic memory device according to claim 8, wherein the first electrode comprises Au, Ag, Cu, Al, Ti, TiN, TiAlN, Ta, TaN, W, WN, Ir, Pt, Pd, Zr, Rh, Ni, Co, Cr, Sn, Zn, Li, Mg, Ca, and/or $IrO_2$, and/or the second electrode comprises Au, Ag, Cu, Al, Ti, TiN, TiAlN, Ta, TaN, W, WN, Ir, Pt, Pd, Zr, Rh, Ni, Co, Cr, Sn, Zn, Li, Mg, Ca, and/or $IrO_2$.

10. The organic memory device according to claim 8, wherein the first electrode comprises polyacetylene, polyaniline, and/or PEDOT(3,4-polyethylenedioxy-thiophenepolystylene-sulfonate), and/or the second electrode comprises polyacetylene, polyaniline, and/or PEDOT(3,4-polyethylenedioxy-thiophenepolystylene-sulfonate).

11. The organic memory device according to claim 1, wherein the organic material layer comprises an organic conductive layer, an organic semiconductor layer, and/or an organic insulating layer.

12. The organic memory device according to claim 11, wherein the organic material layer comprises a polystyrene, a polycarbonate, a polymethylmethacrylate(PMMA), a polyolefine, a polyester, a polyamide, a polyimide, a polyurethane, a polyaccetal, a polysulfonate, a novolac, a polyacetate, a polyalkyd, a polyamideimide, a polysiloxane, a polyarylate, a polyarylsulfone, a polyetherimide, a polytetrafluoro-ethylene, a polychlorotrifluoroethylene, a polyvinylidene fluoride, a polyvinyl fluoride, a polyetherketone, a polyether etherketone, a polybenzoxazole, a poly(phenylene vinylene) (PPV), a polyfluorene (PF), a polythiophene (PT), a poly(paraphenylene) (PPP), a polyvinylcarbazole (PVK), and/or a derivative and/or a copolymer thereof.

13. The organic memory device according to claim 1, wherein the fullerene layer comprises C60, and the organic material layer comprises polyimide.

14. An organic memory device comprising:
a first electrode;
a second electrode; and
a data storage element electrically connected between the first and second electrodes, wherein the data storage element includes an organic material layer on the first electrode, a fullerene layer between the organic material layer and the second electrode, and an organic compound layer between the organic material layer and the fullerene layer, wherein the organic compound layer includes fullerene molecules dispersed in an organic material.

15. The organic memory device according to claim 14, wherein the data storage element is configured to provide at least two different electrically reversible resistance states, to provide reprogrammable operation.

16. The organic memory device according to claim 14, wherein the data storage element is configured to provide a negative differential resistance (NDR) operating region wherein current decreases as voltage increases.

17. The organic memory device according to claim 1 wherein the data storage element is configured to be switched from a first resistance state to an electrically irreversible second resistance state and to maintain the electrically irreversible second resistance state without allowing switching back to the first resistance state to provide one-time programming operation, wherein the first and second resistance states comprise different resistance states.

18. The organic memory device according to claim 17 wherein the first resistance state is a low resistance state and the electrically irreversible second resistance state is a high resistance state.

19. The organic memory device according to claim 1 wherein the fullerene layer is in direct contact with the second electrode.

* * * * *